(12) United States Patent
Yamazaki et al.

(10) Patent No.: US 9,647,131 B2
(45) Date of Patent: May 9, 2017

(54) SEMICONDUCTOR DEVICE, POWER CIRCUIT, AND MANUFACTURING METHOD OF SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Kei Takahashi, Kanagawa (JP); Yoshiaki Ito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/873,249

(22) Filed: Oct. 2, 2015

(65) Prior Publication Data
US 2016/0027922 A1    Jan. 28, 2016

Related U.S. Application Data

(60) Continuation of application No. 14/272,545, filed on May 8, 2014, now Pat. No. 9,153,702, which is a
(Continued)

(30) Foreign Application Priority Data

Sep. 24, 2009    (JP) ................. 2009-218816

(51) Int. Cl.
*H01L 29/786* (2006.01)
*H01L 29/66* (2006.01)
(Continued)

(52) U.S. Cl.
CPC .......... *H01L 29/7869* (2013.01); *H01L 29/04* (2013.01); *H01L 29/24* (2013.01);
(Continued)

(58) Field of Classification Search
None
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 001845354 A | 10/2006 |
| CN | 001906770 A | 1/2007 |

(Continued)

OTHER PUBLICATIONS

Mo et al., "Amorphous Oxide TFT Backplanes for Large Size AMOLED Displays," IDW '08—Proceedings of the 6th International Display Workshops, Dec. 3, 2008, pp. 581-584.*

(Continued)

*Primary Examiner* — Eva Y Montalvo
*Assistant Examiner* — Kevin Quinto
(74) *Attorney, Agent, or Firm* — Fish & Richardson P.C.

(57) ABSTRACT

The semiconductor device includes a first conductive layer over a substrate; an oxide semiconductor layer which covers the first conductive layer; a second conductive layer in a region which is not overlapped with the first conductive layer over the oxide semiconductor layer; an insulating layer which covers the oxide semiconductor layer and the second conductive layer; and a third conductive layer in a region including at least a region which is not overlapped with the first conductive layer or the second conductive layer over the insulating layer.

14 Claims, 11 Drawing Sheets

Related U.S. Application Data division of application No. 12/888,064, filed on Sep. 22, 2010, now Pat. No. 8,723,173.

(51) Int. Cl.

| | | |
|---|---|---|
| *H01L 29/04* | (2006.01) | |
| *H01L 29/24* | (2006.01) | |
| *H01L 29/417* | (2006.01) | |
| *H01L 29/423* | (2006.01) | |
| H01L 21/02 | (2006.01) | |

(52) U.S. Cl.
CPC .. *H01L 29/41733* (2013.01); *H01L 29/42384* (2013.01); *H01L 29/66969* (2013.01); *H01L 21/0237* (2013.01); *H01L 21/02554* (2013.01); *H01L 21/02565* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,262,463 B2 | 8/2007 | Hoffman |
| 7,282,782 B2 | 10/2007 | Hoffman et al. |
| 7,288,818 B2 | 10/2007 | Lee et al. |
| 7,297,977 B2 | 11/2007 | Hoffman et al. |
| 7,314,801 B2 | 1/2008 | Kiesel et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,511,343 B2 | 3/2009 | Li et al. |
| 7,537,976 B2 | 5/2009 | Hirose |
| 7,564,055 B2 | 7/2009 | Hoffman |
| 7,576,394 B2 | 8/2009 | Furuta et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,851,792 B2 | 12/2010 | Aiba et al. |
| 7,893,495 B2 | 2/2011 | Li et al. |
| 7,981,734 B2 | 7/2011 | Furuta et al. |
| 8,148,245 B2 | 4/2012 | Ikisawa et al. |
| 8,202,365 B2 | 6/2012 | Umeda et al. |
| 9,130,049 B2 | 9/2015 | Sano et al. |
| 2001/0046027 A1 | 11/2001 | Tai et al. |
| 2001/0046745 A1* | 11/2001 | Divakaruni ....... H01L 21/26586 438/306 |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017244 A1 | 1/2005 | Hoffman et al. |
| 2005/0017302 A1* | 1/2005 | Hoffman ............... H01L 29/105 257/347 |
| 2005/0099167 A1* | 5/2005 | Karube ................. H02M 3/073 323/282 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0212807 A1* | 9/2007 | Yamada ................ H01L 51/102 438/99 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0035920 A1* | 2/2008 | Takechi ............ H01L 29/78618 257/43 |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140337 A1 | 6/2009 | Yamazaki |
| 2009/0152506 A1 | 6/2009 | Umeda et al. |
| 2009/0152541 A1 | 6/2009 | Maekawa et al. |
| 2009/0160741 A1 | 6/2009 | Inoue et al. |
| 2009/0179199 A1 | 7/2009 | Sano et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0213470 A1 | 8/2010 | Yamazaki et al. |
| 2011/0012131 A1 | 1/2011 | Yamazaki |
| 2015/0325707 A1 | 11/2015 | Sano et al. |

FOREIGN PATENT DOCUMENTS

| | | |
|---|---|---|
| CN | 101326644 A | 12/2008 |
| EP | 1737044 A | 12/2006 |
| EP | 1801887 A | 6/2007 |
| EP | 1921681 A | 5/2008 |
| EP | 2006824 A | 12/2008 |
| EP | 2226847 A | 9/2010 |

(56) References Cited

FOREIGN PATENT DOCUMENTS

| | | |
|---|---|---|
| EP | 2453480 A | 5/2012 |
| EP | 2453481 A | 5/2012 |
| EP | 2455975 A | 5/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-268220 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-298062 A | 10/2003 |
| JP | 2004-055603 A | 2/2004 |
| JP | 2004-103957 A | 4/2004 |
| JP | 2004-273614 A | 9/2004 |
| JP | 2004-273732 A | 9/2004 |
| JP | 2006-024610 A | 1/2006 |
| JP | 2006-121029 A | 5/2006 |
| JP | 2006-165529 A | 6/2006 |
| JP | 2006-286773 A | 10/2006 |
| JP | 2006-352087 A | 12/2006 |
| JP | 2007-134482 A | 5/2007 |
| JP | 2007-158307 A | 6/2007 |
| JP | 2007-173820 A | 7/2007 |
| JP | 2007-286150 A | 11/2007 |
| JP | 2008-098637 A | 4/2008 |
| JP | 2009-167087 A | 7/2009 |
| JP | 2010-263064 A | 11/2010 |
| KR | 2006-0026244 A | 3/2006 |
| KR | 2008-0052107 A | 6/2008 |
| TW | 200936792 | 9/2009 |
| WO | WO-2004/114391 | 12/2004 |
| WO | WO-2005/015643 | 2/2005 |
| WO | WO-2005/074038 | 8/2005 |
| WO | WO-2006/051993 | 5/2006 |
| WO | WO-2007/055256 | 5/2007 |
| WO | WO-2007/089048 | 8/2007 |

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGaO4—ZnO System", Journal of Solid State Chemistry, Apr. 1, 1995, vol. 116, No. 1, pp. 170-178.
Nakamura.M et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327.
Nomura.K et al., "Thin-Film Transistor Fabricated in Single-Crystalline Transparent Oxide Semiconductor", Science, May 23, 2003, vol. 300, No. 5623, pp. 1269-1272.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Costello.M et al., "Electron Microscopy of a Cholesteric Liquid Crystal and its Blue Phase", Phys. Rev. A (Physical Review. A), May 1, 1984, vol. 29, No. 5, pp. 2957-2959.
Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02: Proceedings of the 9th International Display Workshops, Dec. 4, 2002, pp. 295-298.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.
Park.S et al., "Challenge to Future Displays: Transparent AM-OLED Driven by Peald Grown ZNO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phase for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits, 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

(56) References Cited

OTHER PUBLICATIONS

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Displayed on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

(56) References Cited

OTHER PUBLICATIONS

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Chinese Office Action (Application No. 201010293477.5) Dated Jan. 28, 2014.

Taiwanese Office Action (Application No. 099130884) Dated May 12, 2015.

Korean Office Action (Application No. 2010-0091566) Dated Nov. 28, 2016.

\* cited by examiner

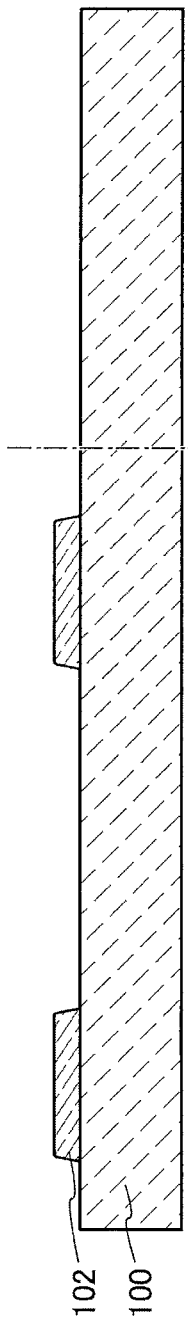
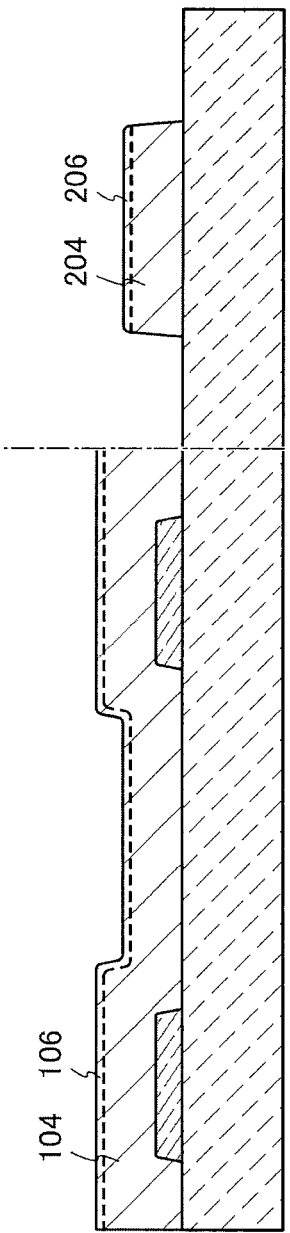
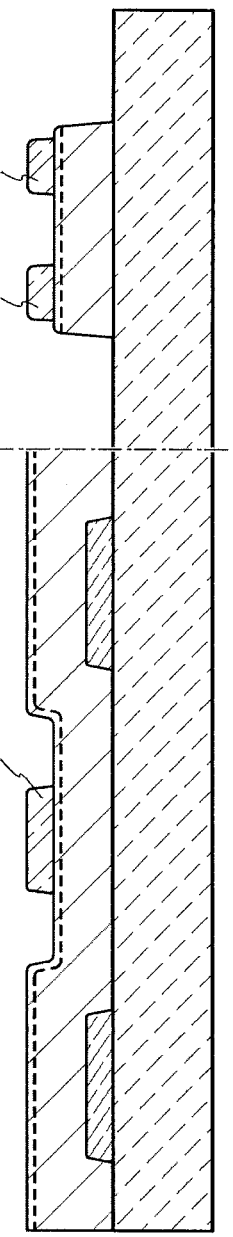
FIG. 7A
FIG. 7B
FIG. 7C

SEMICONDUCTOR DEVICE, POWER CIRCUIT, AND MANUFACTURING METHOD OF SEMICONDUCTOR DEVICE

CROSS-REFERENCE TO RELATED APPLICATIONS

This application is a continuation of U.S. application Ser. No. 14/272,545, filed May 8, 2014, now allowed, which is a divisional of U.S. application Ser. No. 12/888,064, filed Sep. 22, 2010, now U.S. Pat. No. 8,723,173, which claims the benefit of a foreign priority application filed in Japan as Serial No. 2009-218816 on Sep. 24, 2009, all of which are incorporated by reference.

BACKGROUND OF THE INVENTION

1. Field of the Invention

The technical field of the disclosed invention relates to a semiconductor device and a manufacturing method thereof.

2. Description of the Related Art

There are a wide variety of metal oxides and such metal oxides are used for various applications. Indium oxide is a well-known material and is used as a transparent electrode material which is necessary for liquid crystal displays and the like.

Some metal oxides have semiconductor characteristics. The examples of such metal oxides having semiconductor characteristics are, for example, tungsten oxide, tin oxide, indium oxide, zinc oxide, and the like. A thin film transistor in which a channel formation region is formed using such metal oxides is already known (for example, see Patent Documents 1 to 4, Non-Patent Document 1, and the like).

As metal oxides, not only single-component oxides but also multi-component oxides are known. For example, $InGaO_3(ZnO)_m$ (m: natural number) having a homologous phase is known as a multi-component oxide semiconductor including In, Ga, and Zn (for example, see Non-Patent Documents 2 to 4 and the like).

Furthermore, it is confirmed that an oxide semiconductor including such an In—Ga—Zn-based oxide is applicable to a channel formation region of a thin film transistor (for example, see Patent Document 5, Non-Patent Documents 5 and 6, and the like).

REFERENCES

Patent Documents

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 June 1996, Vol. 68 pp. 3650-3652

[Non-Patent Document 2] M. Nakamura, N. Kimizuka, and T. Mohri, "The Phase Relations in the $In_2O_3$—$Ga_2ZnO_4$—ZnO System at 1350° C", *J. Solid State Chem.*, 1991, Vol. 93, pp. 298-315

[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178

[Non-Patent Document 4] M. Nakamura, N. Kimizuka, T. Mohri, and M. Isobe, "Syntheses and crystal structures of new homologous compound, indium iron zinc oxides ($InFeO_3(ZnO)_m$ (m: natural number) and related compounds", *KOTAI BUTSURI (SOLID STATE PHYSICS)*, 1993, Vol. 28, No. 5, pp. 317-327

[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272

[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432 pp. 488-492

SUMMARY OF THE INVENTION

A semiconductor device for high power application such as a power MOSFET needs to have characteristics such as high breakdown voltage, high conversion efficiency, and high-speed switching. Nowadays, silicon is used for a semiconductor material of such a semiconductor device; however, from the above-described point of view, a novel semiconductor material which can further improve the characteristics is required.

As an example of a semiconductor material which can improve the above characteristics, silicon carbide can be given. Since silicon carbide has a small interatomic distance of 0.18 nm in a Si—C bond, a high bond energy, and a large energy gap which is about three times that of silicon, it is known that silicon carbide is advantageous in increasing the breakdown voltage of a semiconductor device, reducing a loss of electric power, and the like.

However, it is difficult to melt silicon carbide because of its characteristics; therefore, silicon carbide cannot be manufactured by a method having high productivity such as a Czochralski (CZ) method or the like which is used for manufacturing a silicon wafer. Moreover, there is also a problem in that silicon carbide has defects called micropipes. Because of these problems, commercialization of a semiconductor device using silicon carbide is delayed.

In view of the foregoing problems, an object of one embodiment of the disclosed invention is to provide a semiconductor device for high power application in which a novel semiconductor material having high productivity is used. Another object of one embodiment of the disclosed invention is to provide a semiconductor device having a novel structure in which the novel semiconductor material is used. Another object of one embodiment of the disclosed invention is to provide a power circuit using the semiconductor device. Another object of one embodiment of the disclosed invention is to provide a preferable method for manufacturing such a semiconductor device.

One embodiment of the disclosed invention is a semiconductor device in which breakdown voltage (e.g., drain breakdown voltage) is increased using an oxide semiconductor material. In particular, it is a semiconductor device using an oxide semiconductor layer which includes a crystal region at a superficial portion.

In addition, one embodiment of the disclosed invention is a method for manufacturing the above-described semiconductor device.

For example, one embodiment of the present invention is a semiconductor device including: a first conductive layer over a substrate; an oxide semiconductor layer which covers the first conductive layer; a second conductive layer in a region which is not overlapped with the first conductive layer and over the oxide semiconductor layer; an insulating layer which covers the oxide semiconductor layer and the second conductive layer; and a third conductive layer in a region including at least a region which is not overlapped with the first conductive layer or the second conductive layer and over the insulating layer.

Another embodiment of the present invention is a semiconductor device including: a first conductive layer over a substrate; an oxide semiconductor layer which covers the first conductive layer and includes a crystal region at an upper superficial portion; a second conductive layer in a region which is not overlapped with the first conductive layer and over the oxide semiconductor layer; an insulating layer which covers the oxide semiconductor layer and the second conductive layer; and a third conductive layer in a region including at least a region which is not overlapped with the first conductive layer or the second conductive layer and over the insulating layer.

Another embodiment of the present invention is a semiconductor device including: an oxide semiconductor layer over a substrate; a first conductive layer over the oxide semiconductor layer; a second conductive layer in a region which is not overlapped with the first conductive layer and over the oxide semiconductor layer; an insulating layer which covers the oxide semiconductor layer, the first conductive layer, and the second conductive layer; and a third conductive layer in a region including at least a region which is not overlapped with the first conductive layer or the second conductive layer and over the insulating layer.

Another embodiment of the present invention is a semiconductor device including: an oxide semiconductor layer which includes a crystal region at an upper superficial portion over a substrate; a first conductive layer over the oxide semiconductor layer; a second conductive layer in a region which is not overlapped with the first conductive layer and over the oxide semiconductor layer; an insulating layer which covers the oxide semiconductor layer, the first conductive layer, and the second conductive layer; and a third conductive layer in a region including at least a region which is not overlapped with the first conductive layer or the second conductive layer and over the insulating layer.

In the above, a region other than the crystal region of the oxide semiconductor layer is preferably amorphous. Further, it is preferable that the crystal region of the oxide semiconductor layer includes $In_2Ga_2ZnO_7$ crystal. Furthermore, it is preferable that the oxide semiconductor layer contains an In—Ga—Zn—O-based oxide semiconductor material.

Further, in the above, it is preferable that the third conductive layer is partly overlapped with the second conductive layer. Furthermore, the first conductive layer serves as one of a source electrode and a drain electrode, the second conductive layer serves as the other of the source electrode and the drain electrode, and the third conductive layer serves as a gate electrode.

Another embodiment of the present invention is a power circuit including the above semiconductor device in which output voltage is changed by switching between an on state and an off state of the semiconductor device in accordance with a pulse signal input to the third conductive layer of the semiconductor device.

Another embodiment of the present invention is a method for manufacturing a semiconductor device including the steps of: forming a first conductive layer over a substrate; forming an oxide semiconductor layer so as to cover the first conductive layer; forming a crystal region at an upper superficial portion of the oxide semiconductor layer by heating the oxide semiconductor layer; forming a second conductive layer in a region which is not overlapped with the first conductive layer and over the oxide semiconductor layer; forming an insulating layer so as to cover the oxide semiconductor layer and the second conductive layer; and forming a third conductive layer in a region including at least a region which is not overlapped with the first conductive layer or the second conductive layer and over the insulating layer.

Another embodiment of the present invention is a method for a semiconductor device including the steps of: foaming an oxide semiconductor layer over a substrate; forming a crystal region at an upper superficial portion of the oxide semiconductor layer by heating the oxide semiconductor layer; forming a first conductive layer over the oxide semiconductor layer; forming a second conductive layer in a region which is not overlapped with the first conductive layer and over the oxide semiconductor layer; forming an insulating layer so as to cover the oxide semiconductor layer, the first conductive layer, and the second conductive layer; and forming a third conductive layer in a region including at least a region which is not overlapped with the first conductive layer or the second conductive layer and over the insulating layer.

In the above, it is preferable that the crystal region is formed by heating the oxide semiconductor layer at 500° C. or higher. Moreover, the oxide semiconductor layer is preferably formed by a sputtering method using an In—Ga—Zn—O-based target.

In the above, the third conductive layer is preferably formed so that part of the third conductive layer is overlapped with the second conductive layer.

Note that in this specification and the like, the term "over" is not meant to be limited to being directly above. For example, the expression "over a substrate" means that the component is above the level of the substrate surface. That is, the term "over" includes a structure in which another component is interposed.

In one embodiment of the disclosed invention, a semiconductor device is formed using an oxide semiconductor layer which has high productivity and a large energy gap. Thus, a semiconductor device which is preferable for high power application and has high breakdown voltage (e.g., drain breakdown voltage and the like) can be obtained.

In one embodiment of the disclosed invention, an oxide semiconductor layer including a crystal region at a superficial portion is used. Accordingly, a semiconductor device in which breakdown voltage is further increased can be obtained.

According to one embodiment of the disclosed invention, a preferable method for manufacturing the above semiconductor device is provided.

BRIEF DESCRIPTION OF THE DRAWINGS

In the accompanying drawings:

FIGS. 7A to 7C are cross-sectional views illustrating a method for manufacturing a semiconductor device;

DETAILED DESCRIPTION OF THE INVENTION

Figure 1A:
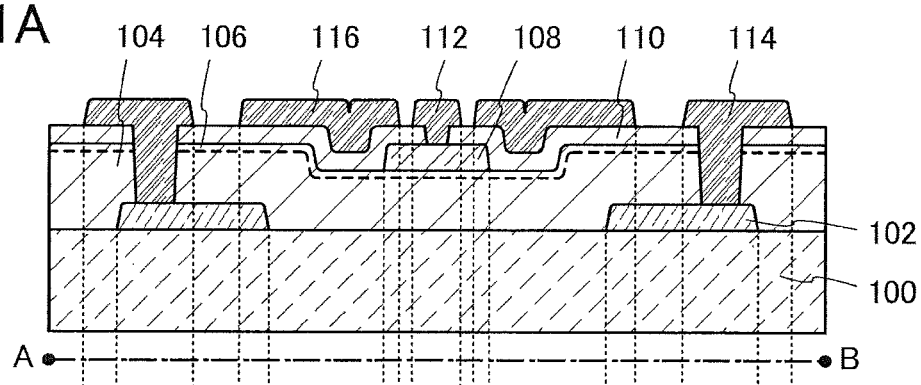
FIGS. 1A and 1B are a cross-sectional view and a plan view illustrating a structure of a semiconductor device, respectively.

Hereinafter, Embodiments are described in detail using the drawings. Note that the present invention is not limited to the description of the embodiments, and it is apparent to those skilled in the art that modes and details can be modified in various ways without departing from the spirit of the present invention disclosed in this specification and the like. A structure of the different embodiment can be implemented in combination as appropriate. On the description of the invention with reference to the drawings, a reference numeral indicating the same part or a part having a similar function is used in common throughout different drawings, and the repeated description is omitted.

(Embodiment 1)

In this embodiment, an example of a semiconductor device and a manufacturing method thereof will be described with reference to FIGS. 1A and 1B and FIGS. 2A to 2E. Note that a power MOS(MIS)FET is described below as an example of a semiconductor device.

<Outline of Semiconductor Device>

Figure 1B:
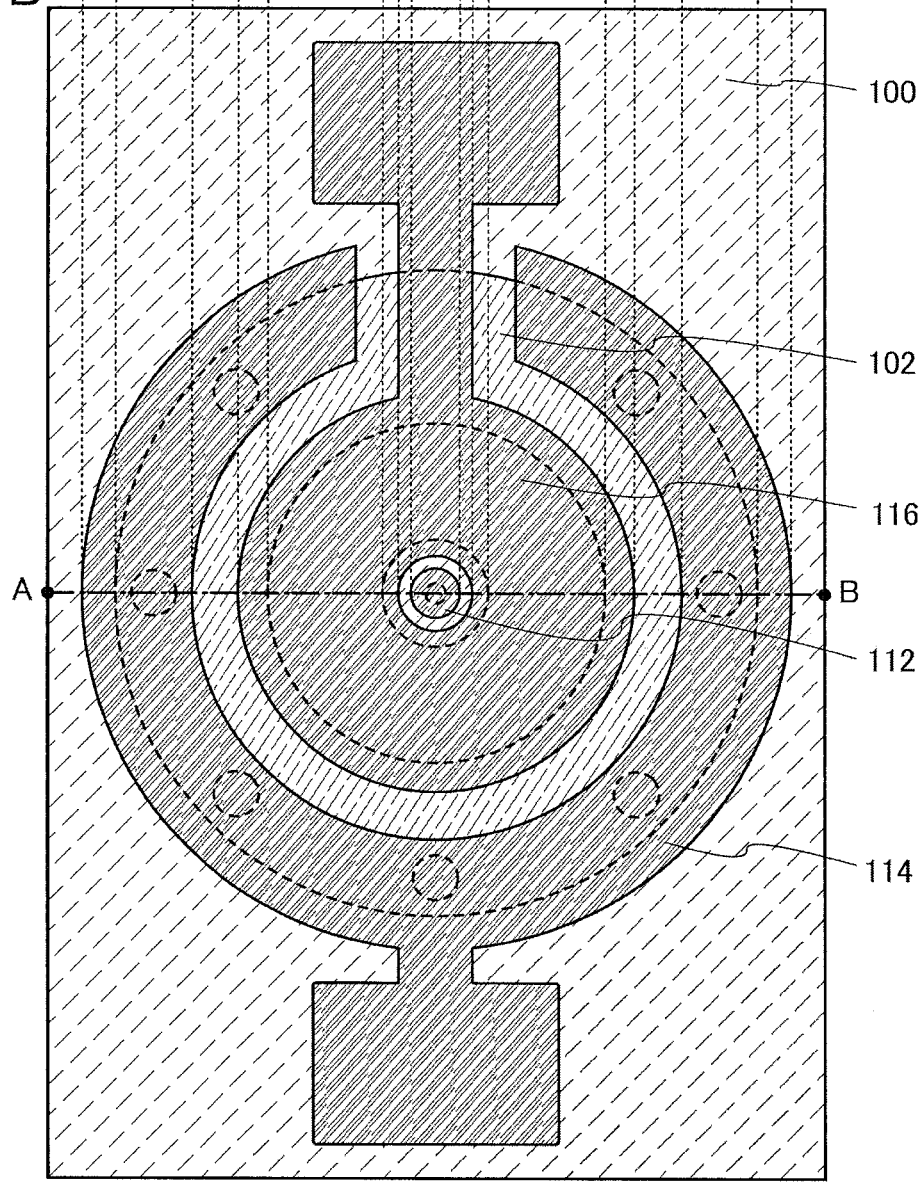

FIGS. 1A and 1B illustrate an example of a structure of a semiconductor device. FIG. 1A is a cross-sectional view and FIG. 1B is a plan view. FIG. 1A corresponds to a cross section along line A-B in FIG. 1B. Note that in the plan view, some components are omitted for ease of understanding.

The semiconductor device illustrated in FIGS. 1A and 1B includes the following: a substrate 100, a conductive layer 102 serving as one of a source electrode and a drain electrode, an oxide semiconductor layer 104, a crystal region 106 in the oxide semiconductor layer 104, a conductive layer 108 serving as the other of the source electrode and the drain electrode, an insulating layer 110 serving as a gate insulating layer, a conductive layer 112 electrically connected to the conductive layer 108, a conductive layer 114 electrically connected to the conductive layer 102, a conductive layer 116 serving as a gate electrode, and the like.

Here, the oxide semiconductor layer 104 is a semiconductor layer which contains an oxide semiconductor material having a large energy gap. With the use of an oxide semiconductor material having a large energy gap for the semiconductor device, breakdown voltage of the semiconductor device (e.g., drain breakdown voltage) is improved.

The crystal region 106 corresponds to a superficial portion (an upper layer) of the oxide semiconductor layer 104 and is a region where part of the oxide semiconductor layer 104 is crystallized. When the crystal region 106 is included, the breakdown voltage of the semiconductor device (e.g., the drain breakdown voltage) can be further improved. Note that a region of the oxide semiconductor layer 104 other than the crystal region 106 is preferably an amorphous region; however, it may be an amorphous region containing crystal grains or a microcrystalline region.

When seen from the above, the conductive layer 116 serving as a gate electrode is provided in the periphery of the conductive layer 108 serving as the other of the source electrode and the drain electrode and the conductive layer 112 electrically connected to the conductive layer 108, and in the periphery of the conductive layer 116, the conductive layer 102 serving as one of the source electrode and the drain electrode and the conductive layer 114 electrically connected to the conductive layer 102 are provided (see FIG. 1B).

That is, the conductive layer 102 serving as one of the source electrode and the drain electrode and the conductive layer 108 serving as the other of the source electrode and the drain electrode are not overlapped with each other. Here, "not overlapped" means that a region in which they are overlapped with each other is not included in a plan view. This is the same in the other description of this specification.

The conductive layer 116 serving as a gate electrode is provided in a region which includes a region which does not overlap with the conductive layer 102 or the conductive layer 108. That is, at least part of the conductive layer 116 is not overlapped with the conductive layer 102 or the conductive layer 108. On the other hand, the other part of the conductive layer 116 may be overlapped with the conductive layer 102 or the conductive layer 108.

In FIGS. 1A and 1B, the conductive layer 108 and the conductive layer 112 are provided at the center, and in the periphery thereof, the conductive layer 116, the conductive layer 102, and the conductive layer 114 are provided; however, a layout of the semiconductor device is not limited thereto. An arrangement of the components can be changed as appropriate as long as a function of the semiconductor device is not negatively affected.

Although the conductive layer 112 electrically connected to the conductive layer 108 serves as a terminal for electrical connection to an external wiring and the like, the conductive layer 112 is not necessarily formed as long as the conductive layer 108 and the external wiring and the like can be directly connected to each other. The same is applied to the conductive layer 114. Note that in FIGS. 1A and 1B, the external wiring and the like which are electrically connected to the conductive layer 112 are not illustrated.

The detail of a structure of a semiconductor device according to this embodiment will be described below with reference to FIGS. 1A and 1B.

<Substrate>

An insulating substrate, a semiconductor substrate, a metal substrate, or the like is employed as the substrate 100. Alternatively, any of these substrates with its surface covered with an insulating material or the like can be used. Note that the substrate 100 preferably has enough heat resistance to withstand heat treatment of the oxide semiconductor layer.

An insulating substrate includes a glass substrate, a quartz substrate, and the like. An insulating substrate containing an organic material such as polyimide, polyamide, polyvinyl phenol, benzocyclobutene resin, acrylic resin, or epoxy resin can also be used. In the case of using an insulating substrate containing an organic material, it is required to select an insulating substrate which can withstand the highest temperature in a process.

A typical example of a semiconductor substrate is a silicon substrate (a silicon wafer). There are plural of grades in silicon substrates, and an inexpensive silicon substrate may be used as long as it has a relatively flat surface. For example, a silicon substrate with purity of about 6N (99.9999%) to 7N (99.99999%) can be used.

As a metal substrate, an aluminum substrate or a copper substrate is typically given. In the case of using a metal substrate, an insulating layer may be formed on a surface thereof in order to ensure insulation. Since a metal substrate has high heat conductivity, it is suitable as a substrate of a semiconductor device for high power application such as a power MOSFET which generate a large amount of heat.

<Oxide Semiconductor Layer>

As an example of a semiconductor material which forms the oxide semiconductor layer 104, one represented by $InMO_3(ZnO)_m$ (m>0) is given. Here, M denotes one or more of metal elements selected from gallium (Ga), iron (Fe), nickel (Ni), manganese (Mn), and cobalt (Co) and the like. For example, the case where Ga is selected as M includes not only the case where only Ga is used but also the case where Ga and the above metal element other than Ga, such as Ni or Fe, are selected. Further, in the oxide semiconductor, in some cases, a transition metal element such as Fe or Ni or an oxide of the transition metal is contained as an impurity element in addition to the metal element contained as M. In this specification and the like, among the oxide semiconductors, an oxide semiconductor containing at least gallium as M is referred to as an In—Ga—Zn—O-based oxide semiconductor.

The In—Ga—Zn—O-based oxide semiconductor material has sufficiently high resistance when there is no electric field and thus off current is sufficiently small. In addition, the In—Ga—Zn—O-based oxide semiconductor material has a large energy gap (a wide gap). Therefore, the In—Ga—Zn—O-based oxide semiconductor material is suitable for a semiconductor device for high power application such as a power MOSFET.

Other examples of semiconductor materials which form the oxide semiconductor layer 104 include, for example, an In—Sn—Zn—O-based oxide semiconductor material, an In—Al—Zn—O-based oxide semiconductor material, a Sn—Ga—Zn—O-based oxide semiconductor material, an Al—Ga—Zn—O-based oxide semiconductor material, a Sn—Al—Zn—O-based oxide semiconductor material, an In—Zn—O-based oxide semiconductor material, a Sn—Zn—O-based oxide semiconductor material, an Al—Zn—O-based oxide semiconductor material, an In—O-based oxide semiconductor material, a Sn—O-based oxide semiconductor material, a Zn—O-based oxide semiconductor material.

The oxide semiconductor layer 104 (except for the crystal region 106) preferably has an amorphous structure; however, it may have a microcrystalline structure, a structure containing crystal grains in an amorphous structure, or the like. In addition, the thickness thereof can be determined as appropriate in accordance with characteristics such as objective breakdown voltage. Specifically, for example, the thickness can be approximately 100 nm to 10 μm.

It is preferable that the crystal region 106 has a structure where crystal grains are arranged. For example, in the case where the oxide semiconductor layer 104 is formed using an In—Ga—Zn—O-based oxide semiconductor material, the crystal region 106 is a region where crystal grains of $In_2Ga_2ZnO_7$ are arranged in a predetermined direction. In particular, in the case where crystal grains are arranged so that c-axis of $In_2Ga_2ZnO_7$ crystals is in a vertical direction with respect to a substrate plane (or a surface of the oxide semiconductor layer), the breakdown voltage of the semiconductor device can be greatly improved, which is preferable. In comparison with c-axis direction, b-axis direction (or a-axis direction) can have the higher breakdown voltage. This is considered to be caused by dielectric constant anisotropy of $In_2Ga_2ZnO_7$. Note that $In_2Ga_2ZnO_7$ crystals are formed so as to have a stacked-layer structure parallel to a-axis and b-axis. That is, c-axis of $In_2Ga_2ZnO_7$ means a vertical direction with respect to a layer which forms $In_2Ga_2ZnO_7$ crystal.

Note that in the above semiconductor device, the crystal region 106 is not an essential component. When sufficient breakdown voltage can be obtained with the use of an oxide semiconductor material, the crystal region 106 is not necessarily provided.

<Insulating Layer>

An insulating material which fauns the insulating layer 110 serving as a gate insulating layer can be selected from silicon oxide, silicon nitride, silicon oxynitride, silicon nitride oxide, aluminum oxide, tantalum oxide, and the like. Alternatively, a composite material of these materials may be used. The insulating layer 110 may have a single-layer structure or a stacked-layer structure of layers using these insulating materials. Note that in general, a MOSFET means a metal-oxide-semiconductor field-effect transistor; however, an insulating layer used for a semiconductor device of the disclosed invention is not necessarily limited to an oxide.

Note that in this specification and the like, the term oxynitride means a substance in which the oxygen content (atoms) exceeds the nitride content (atoms). For example, silicon oxynitride is a substance including oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, the term nitride oxide means a substance in which the nitrogen content (atoms) exceeds the oxygen content (atoms). For example, silicon nitride oxide is a substance including oxygen, nitrogen, silicon, and hydrogen at concentrations ranging from 5 at. % to 30 at. %, 20 at. % to 55 at. %, 25 at. % to 35 at. %, and 10 at. % to 25 at. %, respectively. Note that the above ranges are the values obtained by employing Rutherford backscattering spectrometry (RBS) or hydrogen forward scattering spectrometry (HFS). Further, the total of the constituent element contents does not exceed 100 at. %

<Conductive Layer>

For example, the conductive layer 102 serves as a drain electrode, the conductive layer 108 serves as a source electrode, and the conductive layer 116 serves as a gate electrode. The conductive layer 112 and the conductive layer 114 serve as terminals for electrical connection to an external wiring or the like; however, these are not essential components.

A conductive material which forms the above conductive layers can be selected from aluminum, copper, molybdenum, titanium, chromium, tantalum, tungsten, neodymium, or scandium; an alloy material which contains any of these metal materials as a main component; and a nitride containing any of these metal materials. In addition, an oxide conductive material having a light-transmitting property such as indium oxide, an alloy of indium oxide and tin oxide, an alloy of indium oxide and zinc oxide, zinc oxide, zinc aluminum oxide, zinc aluminum oxynitride, or zinc gallium oxide can be used. The conductive layers may have a single-layer structure or a stacked-layer structure of layers using these conductive materials.

The conductive layer 108 serving as a source electrode is over and in contact with the oxide semiconductor layer 104, and the conductive layer 102 serving as a drain electrode is below and in contact with the oxide semiconductor layer 104. The conductive layer 116 serving as a gate electrode is provided over the insulating layer 110, and an electric field is generated in the oxide semiconductor layer 104.

Note that the distinction between "source" and "drain" is made only for convenience, and a function of each component which forms a semiconductor device should not be construed as being limited by the denomination. This is because functions of the source and the drain may be exchanged with each other in some cases depending on operation of the semiconductor device.

Operation of the semiconductor device of this embodiment will be briefly described below.
<Operation of Semiconductor Device>

In the case where an n-type semiconductor device in which an electron is a carrier, the conductive layer 108 serving as a source electrode is negatively biased and the conductive layer 102 serving as a drain electrode is positively biased while the semiconductor device is normally operated.

The oxide semiconductor layer 104 with a sufficient thickness is interposed between the conductive layer 108 serving as a source electrode and the conductive layer 102 serving as a drain electrode. The oxide semiconductor layer 104 is formed using an oxide semiconductor material having a wide gap and sufficiently high resistance when there is no electric field. Therefore, in the case where the conductive layer 116 serving as a gate electrode is not biased or is negatively biased in a state where the conductive layer 108 is negatively biased and the conductive layer 102 is positively biased, only a small amount of current flows.

When the conductive layer 116 serving as a gate electrode is positively biased, negative charges (electrons) are induced near the interface between the oxide semiconductor layer 104 and the insulating layer 110 in the region overlapped with the conductive layer 116 and a channel is formed. Thus, current flows between the conductive layer 108 serving as a source electrode and the conductive layer 102 serving as a drain electrode.

In one embodiment of the disclosed invention, an oxide semiconductor is used as a semiconductor material; therefore, the breakdown voltage of the semiconductor device (e.g., the drain breakdown voltage) can be improved. This is because the energy gap of the oxide semiconductor is large as compared with that of a general semiconductor material.

When the semiconductor device includes the crystal region 106 where crystal grains are arranged in a predetermined direction, the breakdown voltage of the semiconductor device can be further increased. For example, in the case where an In—Ga—Zn—O-based oxide semiconductor material is used for the oxide semiconductor layer 104, crystal grains are arranged so that c-axis of $In_2Ga_2ZnO_7$ is in a vertical direction with respect to a substrate plane (or a surface of the oxide semiconductor layer), whereby the breakdown voltage of the semiconductor device can be increased.

<Manufacturing Process>

A manufacturing process of the semiconductor device illustrated in FIGS. 1A and 1B will be described with reference to FIGS. 2A to 2E.

Figure 2A:
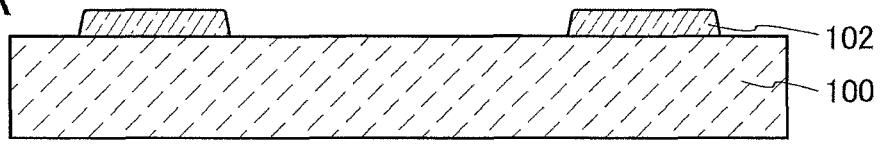
FIGS. 2A to 2E are cross-sectional views illustrating a method for manufacturing a semiconductor device.

First, the conductive layer 102 is formed over the substrate 100 (see FIG. 2A). The description in the above□<Substrate> can be referred to for details of the substrate 100.

A conductive film containing the conductive material described in the description in the above□<Conductive Layer> is formed over the substrate 100 by a sputtering method, a vacuum evaporation method, or the like and then an unnecessary part is removed through etching treatment using a resist mask by a photolithography method, so that the conductive layer 102 is formed. The etching treatment may be either wet treatment or dry treatment. In order to improve coverage with each component formed over the conductive layer 102, the etching treatment is preferably performed so that an acute angle is formed between a side surface of the conductive layer 102 and a bottom surface of the conductive layer 102.

The conductive layer 102 preferably has a stacked-layer structure of a layer formed using aluminum, copper, or the like which is a low-resistance conductive material and a layer formed using molybdenum, titanium, chromium, tantalum, tungsten, neodymium, scandium, or the like which is a high-melting point conductive material because both conductivity and heat resistance can be achieved. For example, a two-layer structure of aluminum and molybdenum, a two-layer structure of copper and molybdenum, a two-layer structure of copper and titanium nitride, a two-layer structure of copper and tantalum nitride, or a two-layer structure of titanium nitride and molybdenum can be employed. Alternatively, a three-layer structure in which aluminum, an alloy of aluminum and silicon, an alloy of aluminum and titanium, an alloy of aluminum and neodymium, or the like is interposed between tungsten, tungsten nitride, titanium nitride, titanium, or the like can be employed.

Figure 2B:
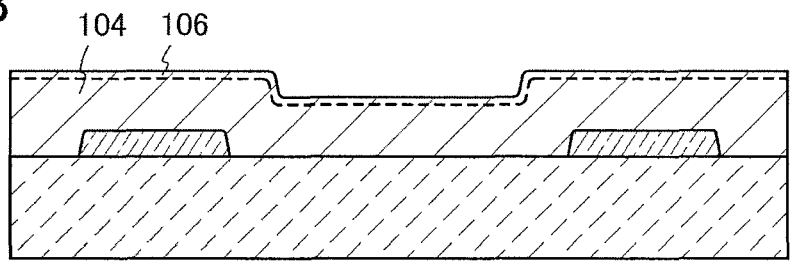

Next, the oxide semiconductor layer 104 including the crystal region 106 is formed so as to cover the conductive layer 102 (see FIG. 2B). Note that the oxide semiconductor layer 104 which does not include the crystal region 106 may be formed.

The oxide semiconductor layer 104 is formed using an oxide semiconductor material described in the description in the above <Oxide Semiconductor Layer>. The oxide semiconductor layer 104 can be formed by a sputtering method or the like under an atmosphere of a rare gas such as argon, an oxygen atmosphere, or a mixed atmosphere of a rare gas and oxygen. In a sputtering method, with the use of a target containing $SiO_2$ at 2 wt % to 10 wt % inclusive, $SiO_x$ (x>0) is contained in the oxide semiconductor layer 104, whereby crystallization of the oxide semiconductor layer 104 can be suppressed. This method is effective in the case where the oxide semiconductor layer 104 having an amorphous structure is desired to be obtained.

For example, an In—Ga—Zn—O-based amorphous oxide semiconductor layer can be obtained as the oxide semiconductor layer 104 using an oxide semiconductor deposition target containing In, Ga, and Zn (such as a target having a composition ratio of In:Ga:Zn=1:1:0.5 [atom %], In:Ga:Zn=1:1:1 [atom %], and In:Ga:Zn=1:1:2 [atom %]) under the following condition: the distance between the substrate and the target is 100 mm; the pressure is 0.6 Pa; the direct current power is 0.5 kW; and the atmosphere is an oxygen atmosphere (the proportion of the oxygen flow is 100%). Note that the case where a pulse direct current power source is used as a power source is preferable because dust in deposition can be reduced and thickness distribution can be evened.

As described in the description in the above <Oxide Semiconductor Layer>, the thickness of the oxide semiconductor layer 104 can be determined as appropriate in accordance with characteristics such as objective breakdown voltage. For example, it may be set approximately 100 nm to 10 μm.

The crystal region 106 is formed through heat treatment after the oxide semiconductor layer 104 is formed. Note that since H2, H, OH, and the like in the oxide semiconductor layer 104 are eliminated through the heat treatment, the heat treatment may be called dehydration treatment or dehydrogenation treatment.

Rapid thermal anneal (RTA) treatment in which a high-temperature inert gas (a nitrogen gas, a rare gas, or the like) is used can be employed as the above heat treatment. Here, the temperature of the heat treatment is preferably 500° C. or higher. There is no particular limitation on the upper limit of the heat treatment temperature; however, it is required to be in the range of allowable temperature limit of the substrate 100. The length of heat treatment is preferably more than or equal to 1 minute and less than or equal to 10 minutes. For example, RTA treatment is preferably performed at 650° C. for approximately 3 minutes to 6 minutes. By employing RTA treatment, heat treatment can be performed for a short time; therefore, adverse effect of heat on the substrate 100 can be reduced. That is, the upper limit of the heat treatment temperature can be increased in this case as compared with the case where heat treatment is performed for a long time. The timing of the heat treatment is not limited to the above timing, and the heat treatment can be performed before or after another process. In addition, the heat treatment may be performed plural times instead of one.

Moreover, it is preferable that in the above heat treatment, hydrogen (including water) and the like are not contained in a process atmosphere. For example, the purity of an inert gas which is introduced into a heat treatment apparatus is set to the purity of 6N (99.9999%, that is, an impurity concentration is 1 ppm or lower) or more, preferably, 7N (99.99999%, that is, an impurity concentration is 0.1 ppm or lower) or more.

Through the above heat treatment, a superficial portion of the oxide semiconductor layer 104 is crystallized to form the crystal region 106 where crystal grains are arranged. The region of the oxide semiconductor layer 104 other than the crystal region 106 has any one of an amorphous structure, a mixed structure of amorphousness and microcrystals, and a microcrystalline structure. Note that the oxide semiconductor crystal region 106 is part of the oxide semiconductor layer 104, and the oxide semiconductor layer 104 includes the crystal region 106.

It is important to prevent hydrogen (including water) being mixed into the oxide semiconductor layer 104 after the above heat treatment. To achieve this, it is necessary that the oxide semiconductor layer is not exposed to the atmosphere at least in the heat treatment and a following temperature decreasing process. This is achieved, for example, by performing the heat treatment and the following temperature decreasing process in one atmosphere. It is needless to say, the atmosphere in the temperature decreasing process may be different from the heat treatment atmosphere. In this case, the atmosphere in the temperature decreasing process can be, for example, an oxygen gas atmosphere, an N₂O gas atmosphere, an ultra-dry air (having a dew point of −40° C. or lower, preferably −60° C. or lower), or the like.

Figure 2C:
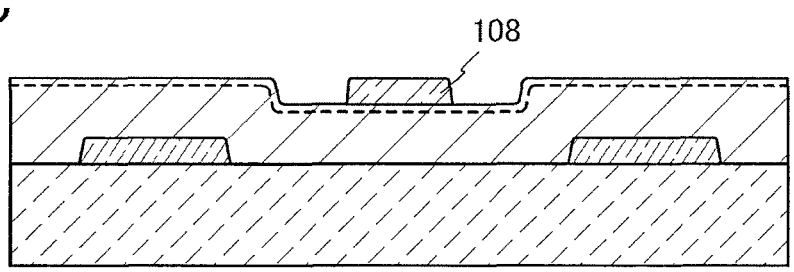

Next, the conductive layer 108 is formed in a region which is not overlapped with the conductive layer 102 and over the oxide semiconductor layer 104 (see FIG. 2C).

The conductive layer 108 can be formed in a manner similar to that of forming the conductive layer 102. That is, a conductive film is formed by a sputtering method, a vacuum evaporation method, or the like and then an unnecessary part is removed through etching treatment using a resist mask, so that the conductive layer 108 is formed. The etching treatment may be either wet treatment or dry treatment; however, in the case where the crystal region 106 is formed in the superficial portion of the oxide semiconductor layer 104, it is necessary that the crystal region 106 is not removed by etching treatment.

For example, in the case where a conductive material such as titanium is used for the conductive layer 108, wet etching treatment using a hydrogen peroxide solution or heated hydrochloric acid as an etchant is preferably employed. When etching treatment is performed under the condition that the etching selectivity of a conductive material forming the conductive layer 108 with respect to an oxide semiconductor material is sufficiently high, the crystal region 106 of the superficial portion can be left.

Figure 2D:
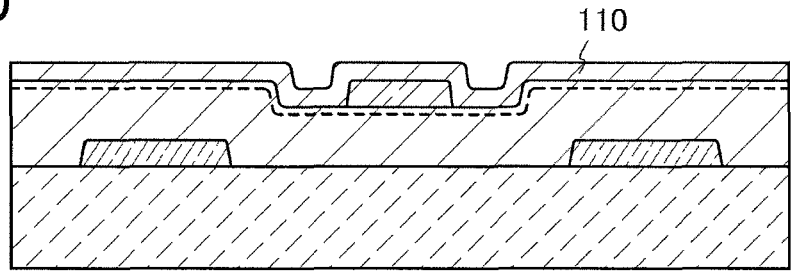

Next, the insulating layer 110 is formed so as to cover the oxide semiconductor layer 104 and the conductive layer 108 (see FIG. 2D).

The insulating layer 110 can be formed using the insulating material described in the description in the above <Insulating Layer>. As a formation method, a CVD method (including a plasma CVD method), a sputtering method, and the like can be given. Note that the thickness of the insulating layer 110 can be determined as appropriate in accordance with characteristics of the semiconductor device; however, it is preferably 10 nm to 1 μm inclusive.

Figure 2E:
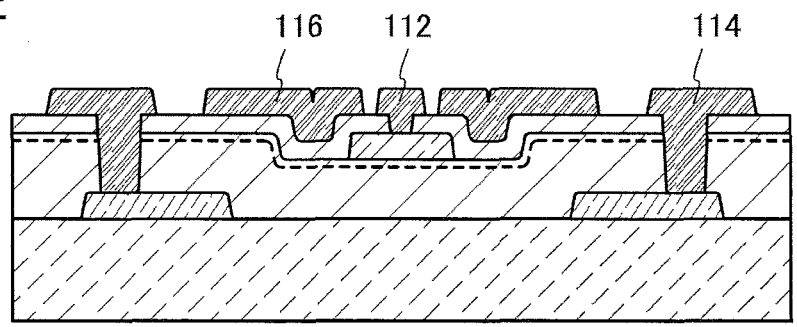

After that, the insulating layer 110 are selectively removed to form openings which reach the conductive layer 102 or the conductive layer 108, and the conductive layer 112 electrically connected to the conductive layer 108, the conductive layer 114 electrically connected to the conductive layer 102, and the conductive layer 116 are formed (see FIG. 2E).

The removal of the insulating layer 110 can be performed by etching treatment using a resist mask. The etching treatment may be either wet treatment or dry treatment.

The conductive layer 112, the conductive layer 114, and the conductive layer 116 can be formed in a manner similar to that of fanning another conductive layer and the like. That is, a conductive film is formed by a sputtering method, a vacuum evaporation method, or the like and then an unnecessary part is removed through etching treatment using a resist mask, so that the conductive layer 112, the conductive layer 114, and the conductive layer 116 are formed. The etching treatment may be either wet treatment or dry treatment.

As described above, a semiconductor device which is a so-called power MOSFET can be manufactured. As described in this embodiment, with the use of an oxide semiconductor material for a semiconductor layer, the breakdown voltage of the semiconductor device can be improved. In particular, by using an oxide semiconductor layer including a crystal region, the breakdown voltage of the semiconductor device can be further improved. Since the oxide semiconductor layer is formed using a method having high productivity such as a sputtering method, productivity of the semiconductor device can be increased and the manufacturing cost can be reduced.

The methods and structures described in this embodiment can be combined as appropriate with any of the methods and structures described in the other embodiments.

(Embodiment 2)

In this embodiment, another example of a semiconductor device and a manufacturing method thereof will be described with reference to FIGS. 3A and 3B and FIGS. 4A to 4E. Note that there are many common points between the semiconductor device described in this embodiment and the semiconductor device according to the above embodiment. Therefore, the common points will be omitted, and different points will be mainly described.

<Outline of Semiconductor Device>

Figure 3A:
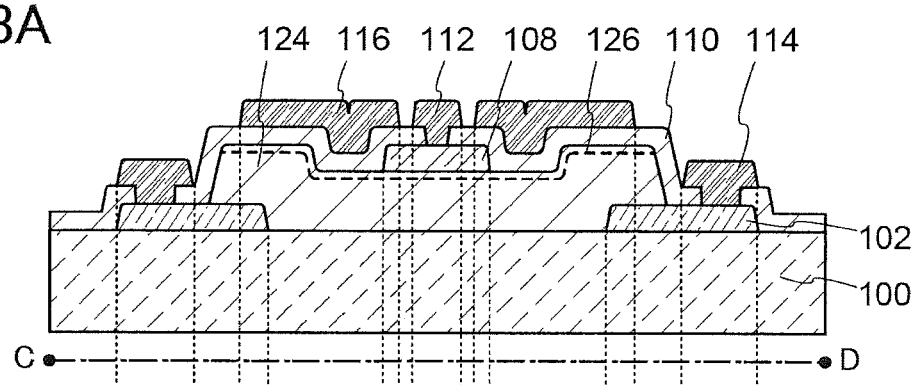
FIGS. 3A and 3B are a cross-sectional view and a plan view illustrating a structure of a semiconductor device, respectively.
Figure 3B:
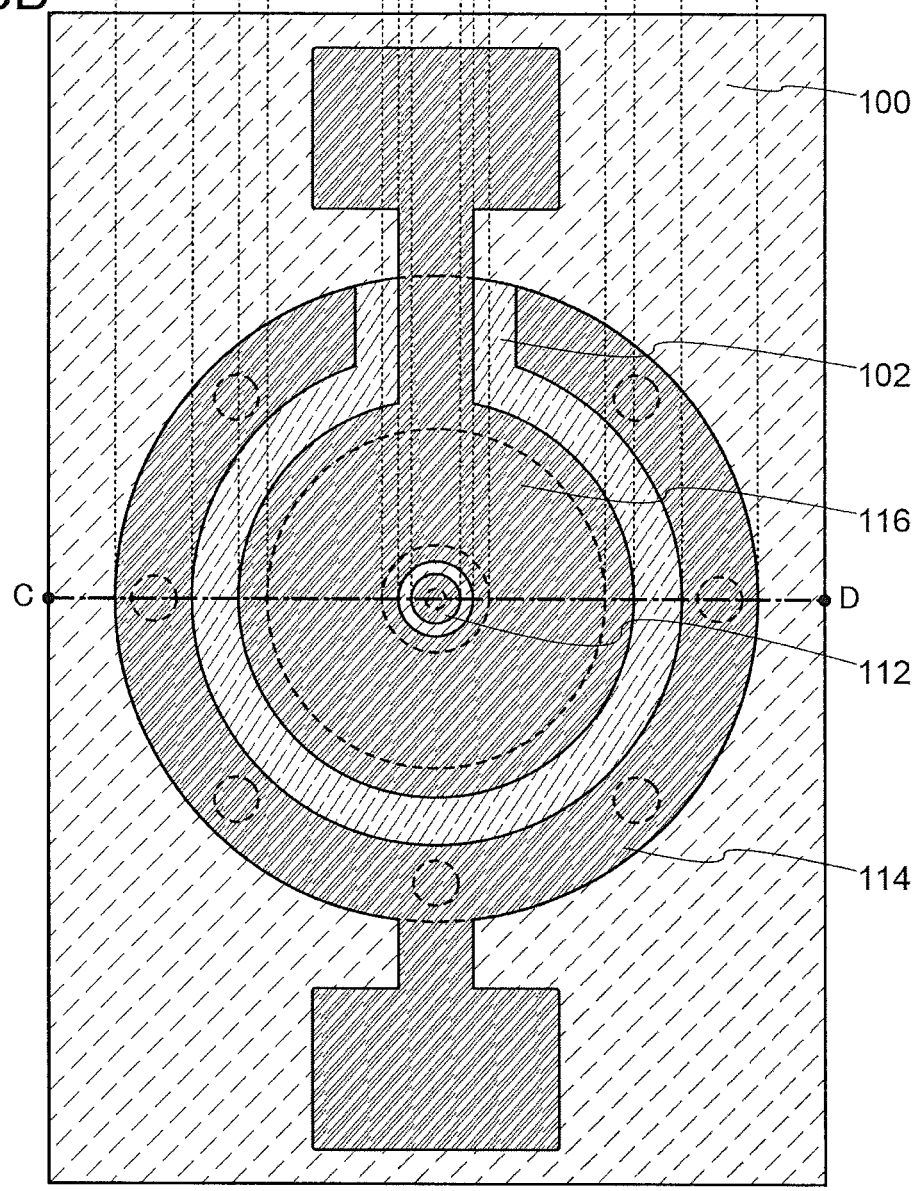

FIGS. 3A and 3B illustrate another example of a structure of a semiconductor device. FIG. 3A is a cross-sectional view, and FIG. 3B is a plan view. FIG. 3A corresponds to a cross section along line C-D in FIG. 3B.

Components of the semiconductor device illustrated in FIGS. 3A and 3B are similar to those of the semiconductor device illustrated in FIGS. 1A and 1B. That is, the semiconductor device includes the following: a substrate 100, a conductive layer 102 serving as one of a source electrode and a drain electrode, an oxide semiconductor layer 124, a crystal region 126 in the oxide semiconductor layer 124, a conductive layer 108 serving as the other of the source electrode and the drain electrode, an insulating layer 110 serving as a gate insulating layer, a conductive layer 112 electrically connected to the conductive layer 108, a conductive layer 114 electrically connected to the conductive layer 102, a conductive layer 116 serving as a gate electrode, and the like.

A different point of the semiconductor device illustrated in FIGS. 3A and 3B from the semiconductor device illustrated in FIGS. 1A and 1B is that the oxide semiconductor layer 104 is patterned. Even when the structure is employed, the semiconductor device illustrated in FIGS. 3A and 3B is operated in a manner similar to that of the semiconductor device illustrated in FIGS. 1A and 1B, and the similar effect can be obtained.

<Manufacturing Process>

The manufacturing process of the semiconductor device is also basically similar to that in FIGS. 2A to 2E. The brief description will be made below with reference to FIGS. 4A to 4E.

Figure 4A:
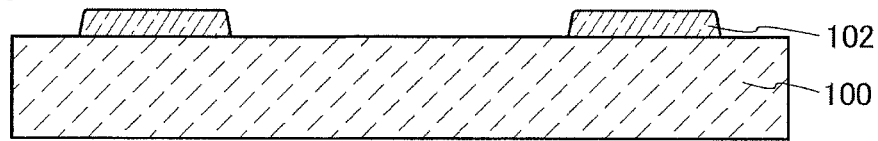
FIGS. 4A to 4E are cross-sectional views illustrating a method for manufacturing a semiconductor device.

First, the conductive layer 102 is formed over the substrate 100 (see FIG. 4A). The above embodiment can be referred to for details.

Figure 4B:
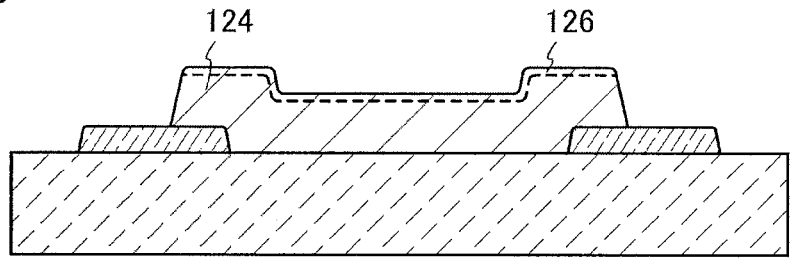

Next, the oxide semiconductor layer 124 including the crystal region 126 is fanned so as to cover part of the conductive layer 102 (see FIG. 4B). A formation method of the oxide semiconductor layer 124 is similar to that in the above embodiment; however, the oxide semiconductor layer 124 in this embodiment is different from the oxide semiconductor layer 104 according to the above embodiment in that the oxide semiconductor layer 124 in this embodiment covers part of the conductive layer 102.

The oxide semiconductor layer 124 in this embodiment can be obtained in such a manner that the oxide semiconductor layer 104 (including the crystal region 106) is formed in accordance with the method described in the above embodiment and the like, and the oxide semiconductor layer 104 is patterned. The patterning can be performed by etching treatment using a resist mask. The etching treatment may be either wet treatment or dry treatment, and it is preferably performed in a manner such that the crystal region 126 is left.

Figure 4C:
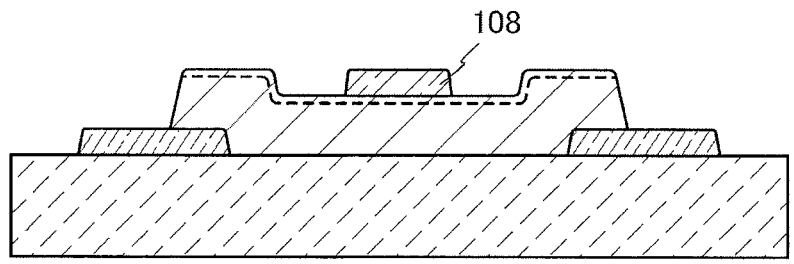

Next, the conductive layer 108 is formed in a region which is not overlapped with the conductive layer 102 and over the oxide semiconductor layer 124 (see FIG. 4C). The above embodiment can be referred to for details.

Figure 4D:
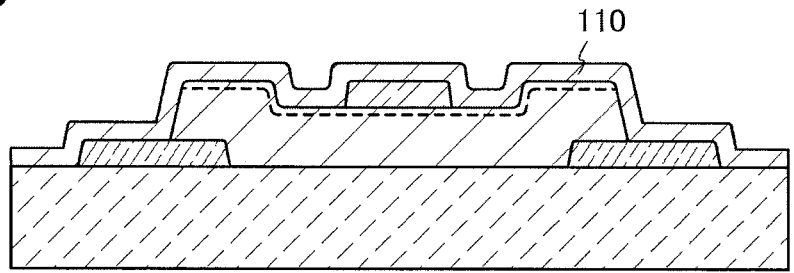

Next, the insulating layer 110 is formed so as to cover the oxide semiconductor layer 124 and the conductive layer 108 (see FIG. 4D). The above embodiment can be referred to for details of the insulating layer 110 as well.

Figure 4E:
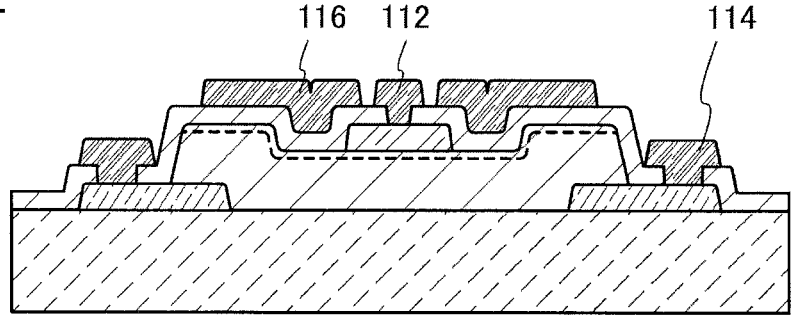

After that, the insulating layer 110 are selectively removed to form openings which reach the conductive layer 102 or the conductive layer 108, and the conductive layer 112 electrically connected to the conductive layer 108, the conductive layer 114 electrically connected to the conductive layer 102, and the conductive layer 116 are formed (see FIG. 4E). The above embodiment can be referred to for details.

As described above, a semiconductor device which is a so-called power MOSFET can be manufactured. The methods and structures described in this embodiment can be combined as appropriate with any of the methods and structures described in the other embodiments.

(Embodiment 3)

In this embodiment, another example of a semiconductor device and a manufacturing method thereof will be described with reference to FIGS. 5A and 5B and FIGS. 6A to 6D. Note that there are many common points between the semiconductor device described in this embodiment and the semiconductor devices according to the above embodiments. Therefore, the common points will be omitted, and different points will be mainly described.

<Outline of Semiconductor Device>

Figure 5A:
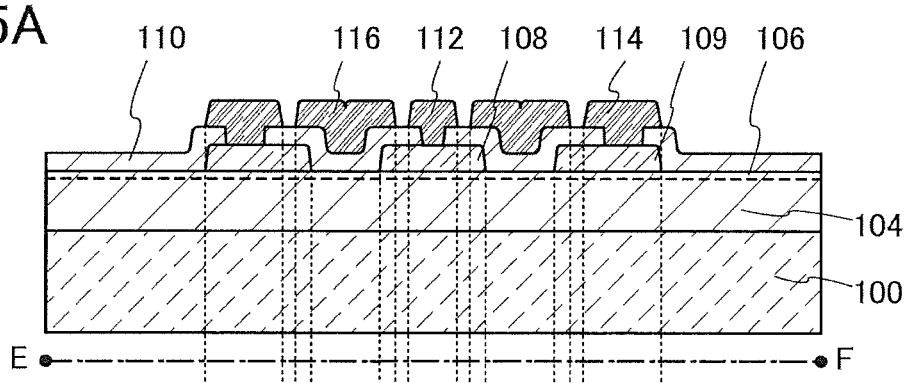
FIGS. 5A and 5B are a cross-sectional view and a plan view illustrating a structure of a semiconductor device, respectively.
Figure 5B:
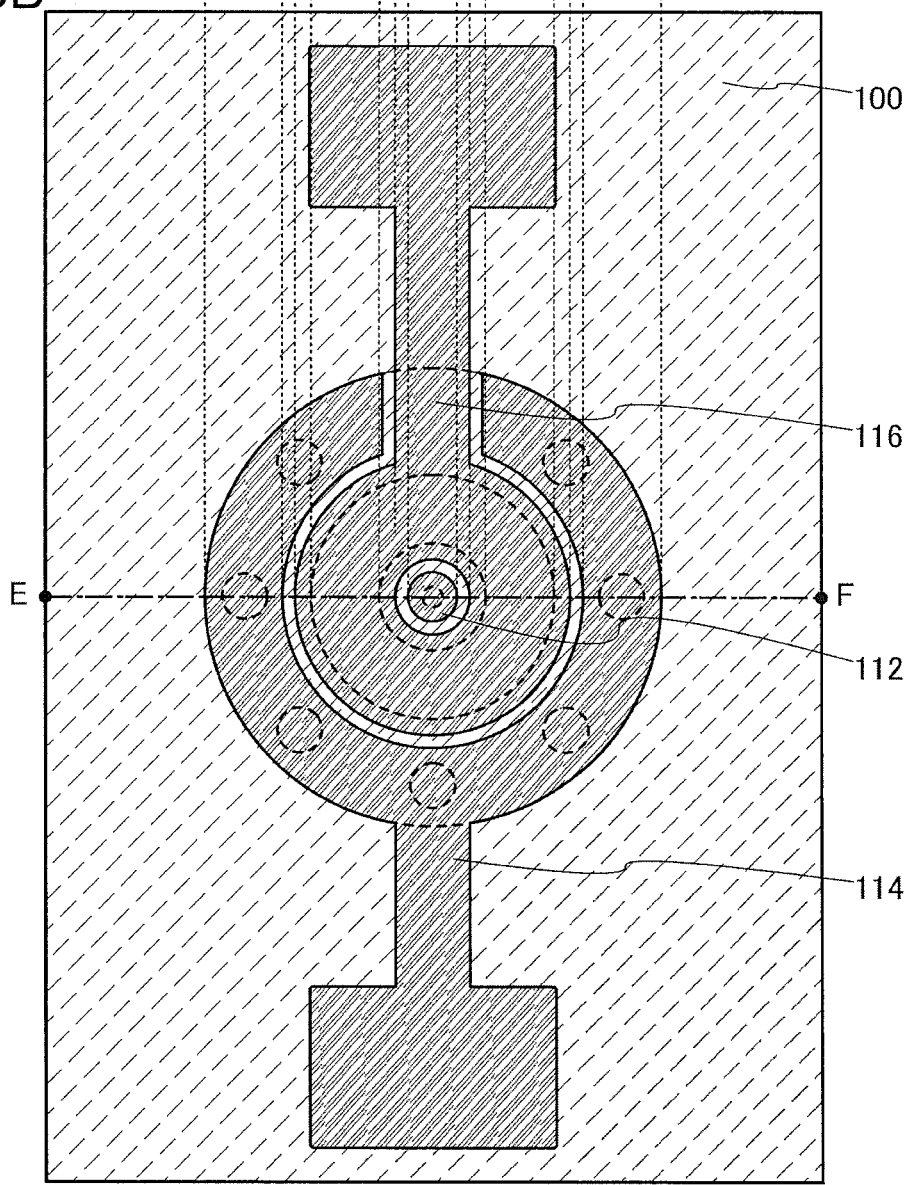

FIGS. 5A and 5B illustrate another example of a structure of a semiconductor device. FIG. 5A is a cross-sectional view and FIG. 5B is a plan view. FIG. 5A corresponds to a cross section along line E-F in FIG. 5B.

The semiconductor device illustrated in FIGS. 5A and 5B corresponds to a device in which the conductive layer 102 of the semiconductor device illustrated in any of the above embodiments is replaced with a conductive layer 109. That is, the semiconductor device illustrated in FIGS. 5A and 5B includes the following: a substrate 100; an oxide semiconductor layer 104; a crystal region 106 in the oxide semiconductor layer 104; a conductive layer 109 serving as one of a source electrode and a drain electrode; a conductive layer 108 serving as the other of the source electrode and the drain electrode; an insulating layer 110 serving as a gate insulating layer; a conductive layer 112 electrically connected to the conductive layer 108; a conductive layer 114 electrically connected to the conductive layer 109; a conductive layer 116 serving as a gate electrode; and the like.

The conductive layer 109 is formed in the same layer as the conductive layer 108. By replacing the conductive layer 102 with the conductive layer 109, all the conductive layers are formed over the oxide semiconductor layer 104. Thus, the planarity of a surface of the oxide semiconductor layer 104 can be improved.

In the case of employing the structure, carriers flow only in the superficial portion of the oxide semiconductor layer 104, namely, the crystal region 106, which is a different point from the semiconductor devices illustrated in the above embodiments. When the semiconductor device described in this embodiment includes the crystal region 106 where crystal grains are arranged in a predetermined direction, the breakdown voltage of the semiconductor device can be further increased. For example, in the case where an In—Ga—Zn—O-based oxide semiconductor material is used for the oxide semiconductor layer 104, crystal grains are arranged so that c-axis of In$_2$Ga$_2$ZnO$_7$ is in a vertical direction with respect to a substrate plate (or a surface of the oxide semiconductor layer), whereby current flows through the semiconductor device in a b-axis direction (or an a-axis direction of In$_2$Ga$_2$ZnO$_7$; therefore, the breakdown voltage of the semiconductor device can be increased. Therefore, an effect of the crystal region 106 that the breakdown voltage of the semiconductor device is improved becomes more significant.

<Manufacturing Process>

A manufacturing process is similar to those described in FIGS. 2A to 2E or FIGS. 4A to 4E except that the conductive layer 102 is not formed and that the conductive layer 109 is formed in a process similar to that of forming the conductive layer 108. The brief description will be made below with reference to FIGS. 6A to 6D.

Figure 6A:
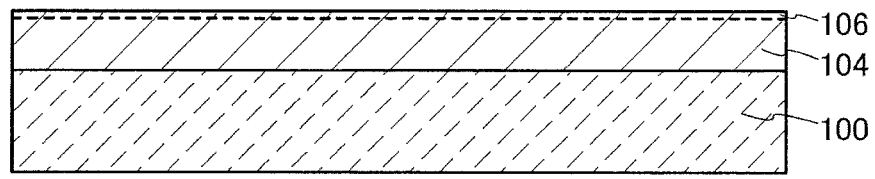
FIGS. 6A to 6D are cross-sectional views illustrating a method for manufacturing a semiconductor device.

First, the oxide semiconductor layer 104 is formed over the substrate 100 (see FIG. 6A). The above embodiments can be referred to for details of formation of the oxide semiconductor layer 104 and the like.

Figure 6B:
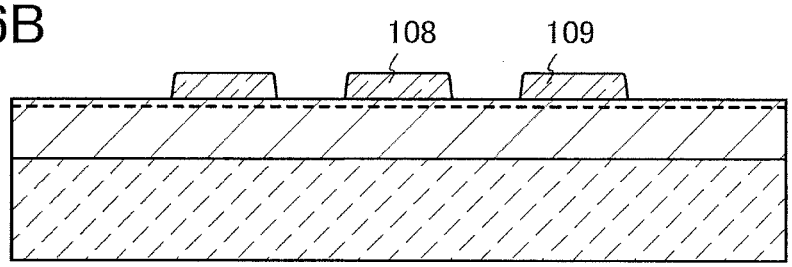

Next, the conductive layer 108 and the conductive layer 109 are formed over the oxide semiconductor layer 104 (see FIG. 6B). The conductive layer 109 can be formed in a manner similar to that of forming the conductive layer 108. Here, it needs to be noted that the conductive layer 108 and the conductive layer 109 are formed in a state where they are separated from each other. The above embodiment can be referred to for details of formation and the like of the conductive layer 108.

Figure 6C:
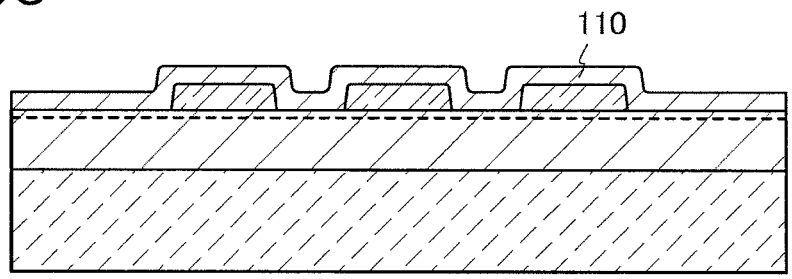

Next, the insulating layer 110 is formed so as to cover the oxide semiconductor layer 104, the conductive layer 108, and the conductive layer 109 (see FIG. 6C). The above embodiment can be referred to for details of the insulating layer 110 as well.

Figure 6D:
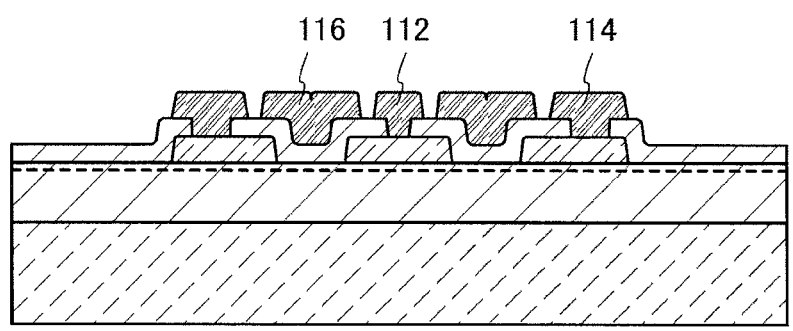

After that, the insulating layer 110 are selectively removed to form openings which reach the conductive layer 108 or the conductive layer 109, and the conductive layer 112 electrically connected to the conductive layer 108, the conductive layer 114 electrically connected to the conductive layer 109, and the conductive layer 116 are formed (see FIG. 6D). The above embodiment can be referred to for details.

As described above, a semiconductor device which is a so-called power MOSFET can be manufactured. The methods and structures described in this embodiment can be combined as appropriate with any of the methods and structures described in the other embodiments.

(Embodiment 4)

In this embodiment, an example of a method for manufacturing a so-called power MOSFET and a thin film transistor over the same substrate in the same process will be described with reference to FIGS. 7A to 7C and FIGS. 8A and 8B. Note that the semiconductor device illustrated in FIGS. 1A and 1B is formed as a power MOSFET in this example below.

A manufacturing process of the semiconductor device illustrated in this embodiment corresponds to a process in which a manufacturing process of a thin film transistor is added to that illustrated in FIGS. 2A to 2E. That is, a basic manufacturing process is similar to the manufacturing process illustrated in FIGS. 2A to 2E. Note that required characteristics are generally different between a power MOSFET and a thin film transistor, and the sizes thereof and the like are preferably determined as appropriate in accordance with the request. In FIGS. 7A to 7C and FIGS. 8A and 8B, the power MOSFET and the thin film transistor are illustrated by almost the same size; however, this is for ease of understanding and does not define the relation of the actual sizes.

First, a conductive layer 102 is formed over a substrate 100 (see FIG. 7A). The above embodiment can be referred to for details.

Next, an oxide semiconductor layer 104 including a crystal region 106 is formed so as to cover the conductive layer 102 and an oxide semiconductor layer 204 including a crystal region 206 which is a component of the thin film transistor is formed (see FIG. 7B). The oxide semiconductor layer 104 and the oxide semiconductor layer 204 can be obtained in such a manner that an oxide semiconductor layer (including a crystal region) is formed in accordance with the method in any of the above embodiments and then patterned. The patterning can be performed by etching treatment using a resist mask. The etching treatment may be either wet treatment or dry treatment, and it is preferably performed in a manner such that the crystal region is left.

Next, a conductive layer 108 is formed in a region which is not overlapped with the conductive layer 102 over the oxide semiconductor layer 104, and a conductive layer 208 and a conductive layer 209 are formed over the oxide semiconductor layer 204 (see FIG. 7C). The conductive layer 208 serves as one of a source electrode and a drain electrode of the thin film transistor, and the conductive layer 209 serves as the other of the source electrode and the drain electrode of the thin film transistor. A manufacturing process of the conductive layer 208 and the conductive layer 209 are similar to that of the conductive layer 108. The above embodiment can be referred to for details of the manufacturing process of the conductive layer 108.

Figures 8A, 8B:
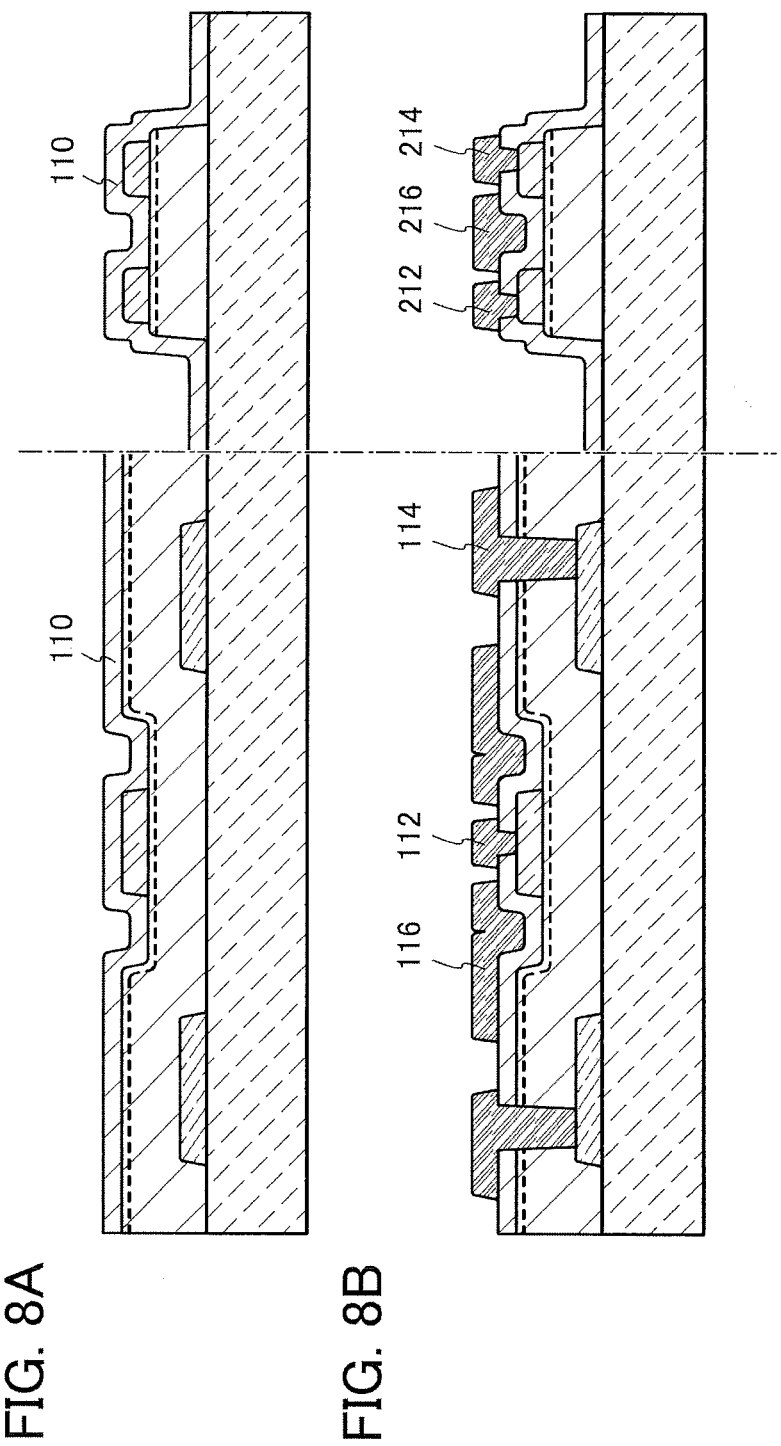
FIGS. 8A and 8B are cross-sectional views illustrating a method for manufacturing a semiconductor device.

Next, an insulating layer 110 is formed so as to cover the oxide semiconductor layer 104, the conductive layer 108, the oxide semiconductor layer 204, the conductive layer 208, and the conductive layer 209 (see FIG. 8A). The insulating layer 110 also functions as the gate insulating layer of the thin film transistor. The above embodiment can be referred to for details of the manufacturing process of the insulating layer 110.

After that, the insulating layer 110 are selectively removed to form openings which reach the conductive layer 102, the conductive layer 108, the conductive layer 208, or the conductive layer 209. Then, the conductive layer 112 electrically connected to the conductive layer 108, the conductive layer 114 electrically connected to the conductive layer 102, the conductive layer 116, a conductive layer 212 electrically connected to the conductive layer 208, a conductive layer 214 electrically connected to the conductive layer 209, and the conductive layer 216 are formed (see FIG. 8B). The manufacturing process of the conductive layer 212, the conductive layer 214, and the conductive layer 216 is similar to that of the conductive layer 112, the conductive layer 114, and the conductive layer 116. The above embodiment can be referred to for details.

As described above, a power MOSFET and a thin film transistor can be formed over the same substrate in a similar process.

By a method illustrated in this embodiment and the like, a power MOSFET and a thin film transistor can be formed over the same substrate in a similar process. Thus, a variety of integrated circuits and a power circuit can be formed over the same substrate.

Note that in this embodiment, the case where the oxide semiconductor layer 104 of the power MOSFET and the oxide semiconductor layer 204 of the thin film transistor are formed in the same process is described; however, the thicknesses of the oxide semiconductor layers needed for a power MOSFET and a thin film transistor are different from each other in some cases. Therefore, the oxide semiconductor layer 104 and the oxide semiconductor layer 204 may be separately formed in different processes. Specifically, there are the following methods: a method in which the manufacturing process of the oxide semiconductor layer is divided into two steps including a first step in which one of the oxide semiconductor layer 104 and the oxide semiconductor layer 204 is formed and a second step in which the other of the oxide semiconductor layer 104 and the oxide semiconductor layer 204 is formed; a method in which the thickness of a thick oxide semiconductor layer is selectively reduced by etching treatment or the like to form the oxide semiconductor layer 104 and the oxide semiconductor layer 204; and the like.

The same can be said for the insulating layer 110, and the insulating layer 110 of the power MOSFET and the insulating layer 110 of the thin film transistor may be separately formed so as to have different thicknesses. Specifically, there are the following methods: a method in which the manufacturing process of the insulating layer is divided into two steps including a first step in which one of the insulating layer over the oxide semiconductor layer 104 and the insulating layer over the oxide semiconductor layer 204 is formed and a second step in which the other of the insulating layer over the oxide semiconductor layer 104 and the insulating layer over the oxide semiconductor layer 204 is formed; a method in which the thickness of a thick insulating layer is selectively reduced by etching treatment or the like to fottn the insulating layer over the oxide semiconductor layer 104 and the insulating layer over the oxide semiconductor layer 204; and the like.

The methods and structures described in this embodiment can be combined as appropriate with any of the methods and structures described in the other embodiments.

(Embodiment 5)

In this embodiment, an example of a circuit using a semiconductor device according to the disclosed invention is described with reference to FIG. 9 and FIGS. 10A to 10C. Note that a DC-DC converter which is an example of a power circuit (a power conversion circuit and the like) will be described below.

A DC-DC converter is a circuit which converts a direct current voltage to another direct current voltage. As a conversion method of a DC-DC converter, a linear method and a switching method are typically given. Since a DC-DC converter using a switching method has excellent conversion efficiency, it is preferable to reduce power consumption in electronic devices. Here, a DC-DC converter using a switching method, especially a chopper method is described.

Figure 9:
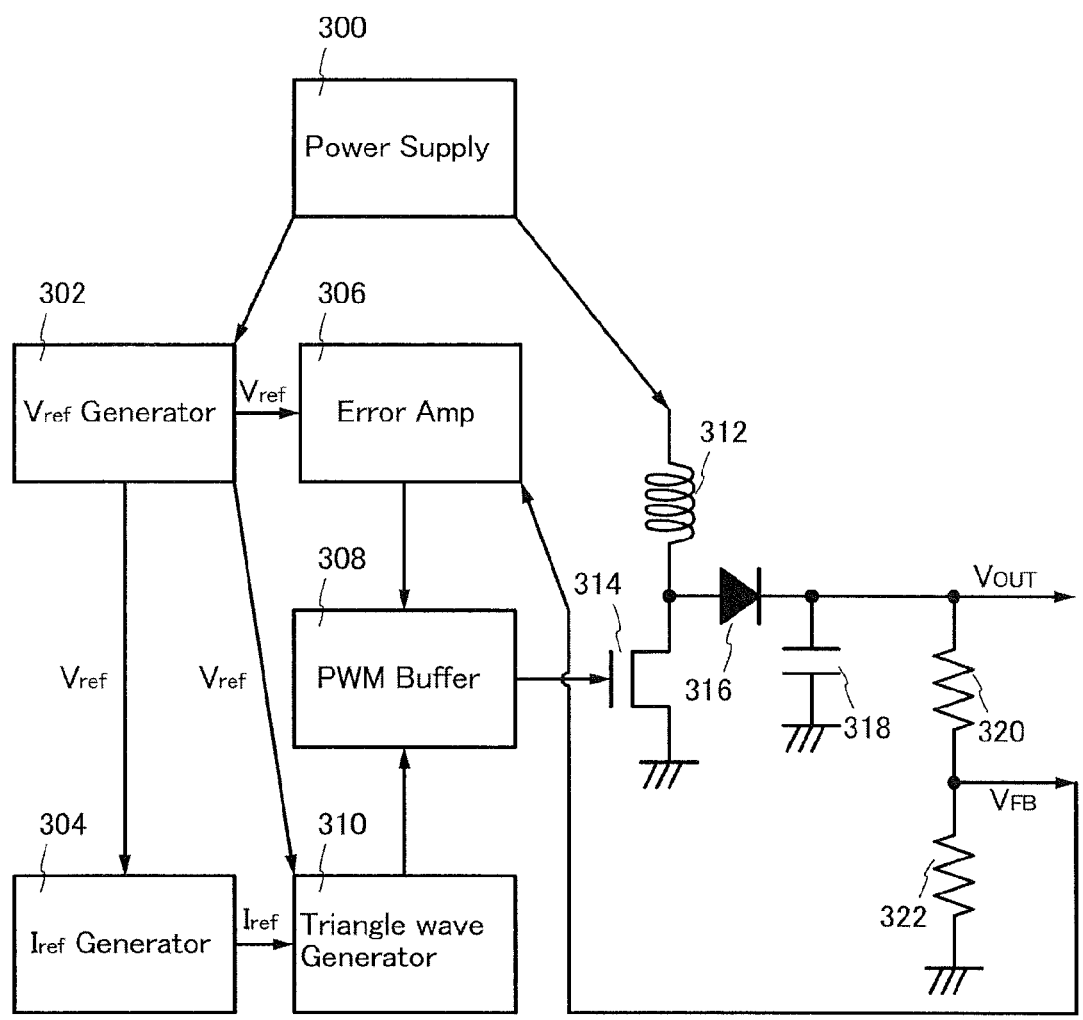
FIG. 9 is a diagram illustrating an example of a structure of a DC-DC converter.

The DC-DC converter illustrated in FIG. 9 includes a power supply 300, a reference voltage generator 302, a reference current generator 304, an error amplifier 306, a PWM buffer 308, a triangle wave generator 310, a coil 312, a power MOSFET 314, a diode 316, a capacitor 318, a resistor 320, a resistor 322, and the like. Note that an n-type power MOSFET is used here as the power MOSFET 314.

Each reference voltage (Vref) is generated in the reference voltage generator 302. Further, in the reference current generator 304, reference current ($I_{ref}$) and bias current are generated utilizing the reference voltage ($V_{ref}$) generated in the reference voltage generator 302.

The error amplifier 306 integrates the difference between the reference voltage ($V_{ref}$) from the reference voltage generator 302 and feedback voltage ($V_{FB}$) and outputs the result to the PWM buffer 308. The triangle wave generator 310 generates a triangle wave from the reference voltage ($V_{ref}$) and the reference current ($I_{ref}$) and outputs it to the PWM buffer 308.

The PWM buffer 308 compares the output from the error amplifier 306 and the triangle wave from the triangle wave generator 310 and outputs a pulse signal to the power MOSFET 314.

In the case where the pulse signal from the PWM buffer 308 is a high potential, the n-type power MOSFET 314 switches to an on state, and a potential on an input side of the diode 316 becomes a ground potential (a low potential). Therefore, in a period that the pulse signal is a high potential, the output voltage ($V_{OUT}$) is gradually decreased.

On the other hand, in the case where the pulse signal from the PWM buffer 308 is a low potential, the n-type power MOSFET 314 switches to an off state, and the potential on the input side of the diode 316 is increased. Therefore, in a period that the pulse signal is a low potential, the output voltage ($V_{OUT}$) is gradually increased.

Since the change in the output voltage ($V_{OUT}$) due to the pulse signal from the PWM buffer 308 is very small, the output voltage can be kept almost constant by using the DC-DC converter.

Note that in the above DC-DC converter, the coil 312 is provided to relieve a change in current due to switching of the power MOSFET 314. The capacitor 318 is provided to suppress a steep change in output voltage ($V_{OUT}$). The resistor 320 and the resistor 322 are provided to generate feedback voltage ($V_{FB}$) from the output voltage ($V_{OUT}$).

Figure 10A:
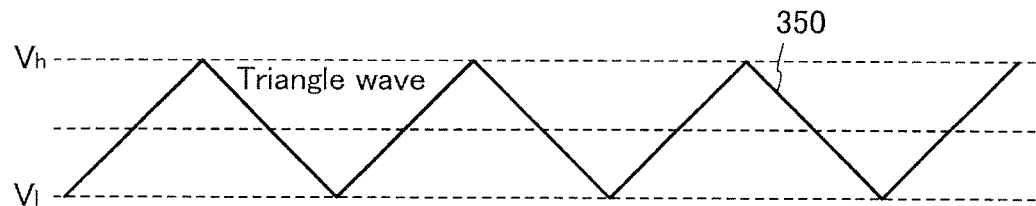
FIGS. 10A to 10C are diagrams illustrating an example of an output waveform of a circuit included in a DC-DC converter.
Figure 10B:
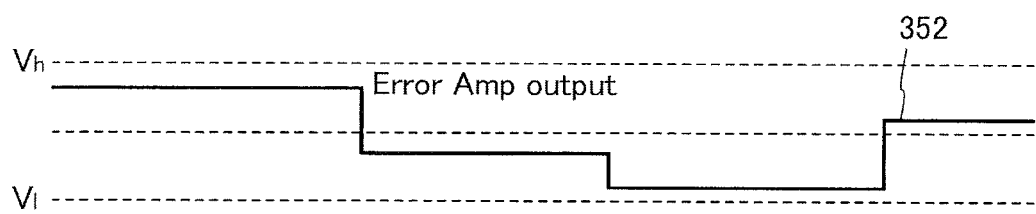
Figure 10C:
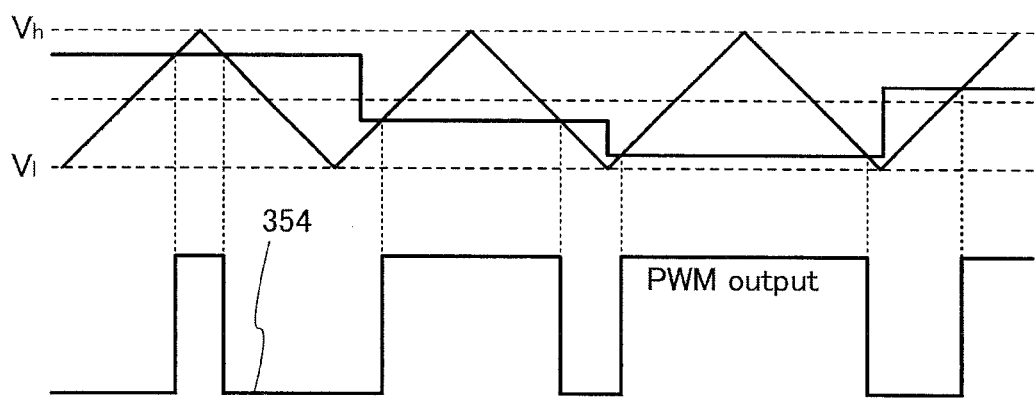

FIGS. 10A to 10C show an example of an output waveform of a circuit included in the DC-DC converter.

FIG. 10A shows a triangle wave 350 output from the triangle wave generator 310 and FIG. 10B shows an output waveform 352 from the error amplifier 306.

FIG. 10C shows a pulse signal 354 generated in the PWM buffer 308. When the triangle wave 350 and the output waveform 352 are input to the PWM buffer 308, the PWM buffer 308 compares them to generate the pulse signal 354. Then, the pulse signal 354 is output to the power MOSFET 314 and the output voltage ($V_{OUT}$) is determined.

As described above, the power MOSFET according to the disclosed invention can be applied to a DC-DC converter. The power MOSFET according to the disclosed invention has high breakdown voltage, and reliability of a DC-DC converter using it can be increased. Since the manufacturing cost of the power MOSFET according to the disclosed invention is reduced, the manufacturing cost of the DC-DC converter using it is also reduced. Thus, when a semiconductor device according to the disclosed invention is used for an electronic circuit, advantages of improvement in reliability, reduction in manufacturing cost, and the like can be obtained.

Note that the DC-DC converter described in this embodiment is only an example of a power circuit using the semiconductor device of the disclosed invention, and the semiconductor device of the disclosed invention can be applied to another circuit as a matter of course. The methods and structures described in this embodiment can be combined as appropriate with any of the methods and structures described in the other embodiments.

(Embodiment 6)

In this embodiment, an example of a solar power generation system provided with an inverter formed using the semiconductor device of the disclosed invention will be described with reference to FIG. 11. Note that an example of a structure of a solar power generation system installed on a house and the like is shown here.

Figure 11:
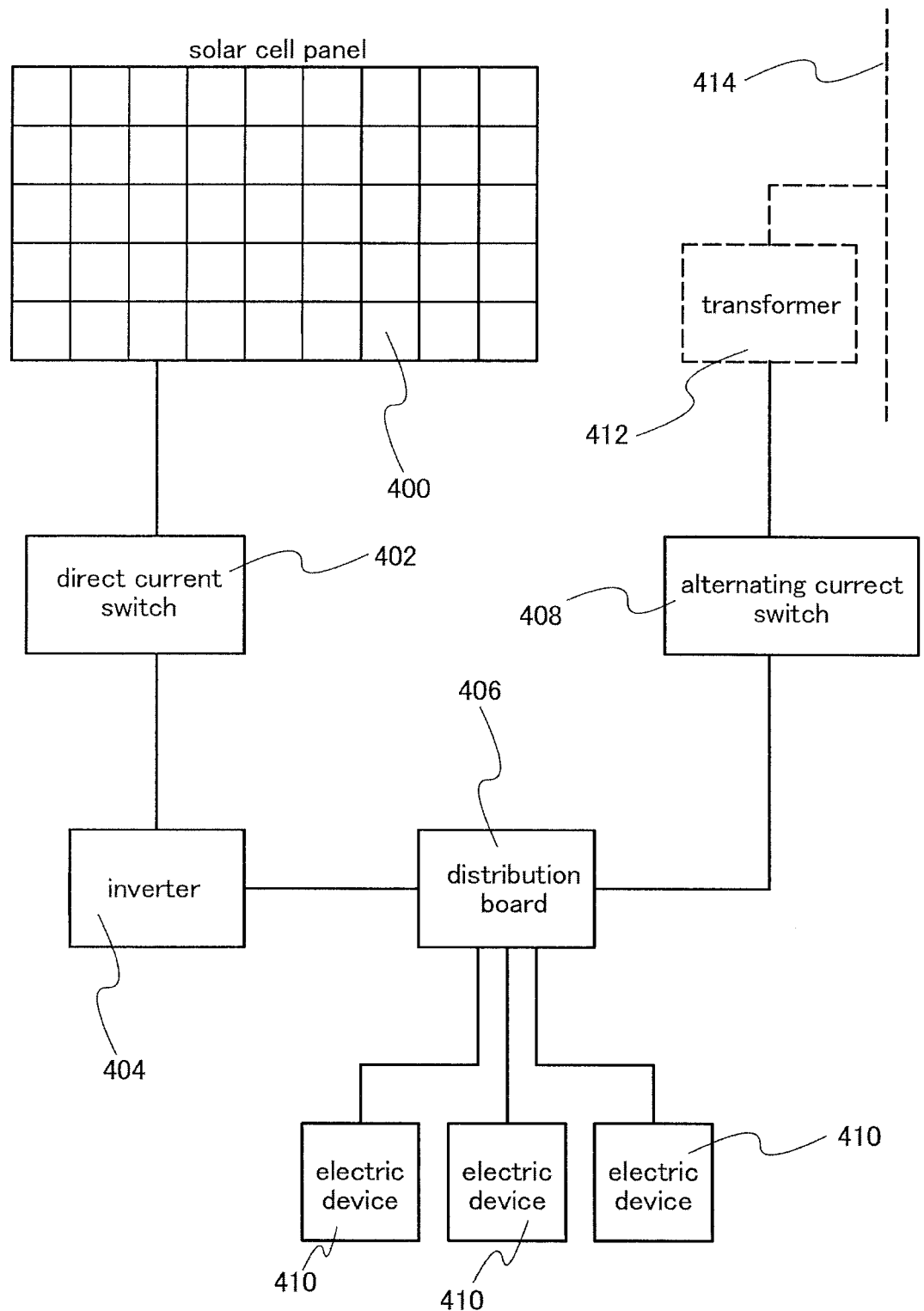
FIG. 11 is a diagram illustrating an example of a solar power generation system provided with an inverter.

A residential solar power generation system illustrated in FIG. 11 is a system in which a method for supplying electric power is changed in accordance with a state of solar power generation. When solar power generation is performed, for example, when the sun shines, electric power generated by solar power generation is consumed inside the house, and surplus electric power is supplied to an electric grid 414 from an electric power company. On the other hand, at night time or at the time of rain when electric power is insufficient, electric power is supplied from the electric grid 414 and is consumed inside the house.

The residential solar power generation system illustrated in FIG. 11 includes a solar cell panel 400 which converts sunlight into electric power (direct current power), an inverter 404 which converts the electric power from direct current into alternating current, and the like. Alternating current power output from the inverter 404 is used as electric power for operating various types of electric devices 410.

Surplus electric power is supplied to outside the house through the electric grid 414. That is, electric power can be sold using this system. A direct current switch 402 is provided to select connection or disconnection between the solar cell panel 400 and the inverter 404. An alternating current switch 408 is provided to select connection or disconnection between a distribution board 406 and a transformer 412 connected to the electric grid 414.

When the semiconductor device of the disclosed invention is applied to the above inverter, a highly reliable and inexpensive solar power generation system can be realized.

The methods and structures described in this embodiment can be combined as appropriate with any of the methods and structures described in the other embodiments.

This application is based on Japanese Patent Application serial no. 2009-218816 filed with Japan Patent Office on Sep. 24, 2009, the entire contents of which are hereby incorporated by reference.

What is claimed is:

1. A semiconductor device comprising:
   an oxide semiconductor layer over a substrate;
   a source electrode in contact with the oxide semiconductor layer;
   a drain electrode in contact with the oxide semiconductor layer;
   a gate insulating layer over the oxide semiconductor layer, the source electrode, and the drain electrode;
   a gate electrode over the gate insulating layer; and
   a first conductive layer in contact with one of the source electrode and the drain electrode through a first opening in the gate insulating layer,
   wherein the one of the source electrode and the drain electrode and the first conductive layer are located inside the gate electrode when seen from above.

2. The semiconductor device according to claim 1, wherein the one of the source electrode and the drain electrode is located inside the other of the source electrode and the drain electrode when seen from above.

3. The semiconductor device according to claim 1, wherein the oxide semiconductor layer comprises indium, gallium, and zinc.

4. The semiconductor device according to claim 1, wherein the oxide semiconductor layer comprises a crystal region.

5. The semiconductor device according to claim 1,
   wherein one of the source electrode and the drain electrode is provided between the substrate and the oxide semiconductor layer, and
   wherein the other of the source electrode and the drain electrode is provided between the oxide semiconductor layer and the gate insulating layer.

6. The semiconductor device according to claim 1, wherein the source electrode and the drain electrode are provided between the oxide semiconductor layer and the gate insulating layer.

7. A power circuit comprising the semiconductor device according to claim 1.

8. A semiconductor device comprising:
   an oxide semiconductor layer over a substrate;
   a source electrode in contact with the oxide semiconductor layer;
   a drain electrode in contact with the oxide semiconductor layer;
   a gate insulating layer over the oxide semiconductor layer, the source electrode, and the drain electrode;
   a gate electrode over the gate insulating layer;
   a first conductive layer in contact with one of the source electrode and the drain electrode through a first opening in the gate insulating layer; and
   a second conductive layer in contact with the other of the source electrode and the drain electrode through a second opening in the gate insulating layer,
   wherein the one of the source electrode and the drain electrode and the first conductive layer are located inside the gate electrode when seen from above.

9. The semiconductor device according to claim 8, wherein the one of the source electrode and the drain electrode is located inside the other of the source electrode and the drain electrode when seen from above.

10. The semiconductor device according to claim 8, wherein the oxide semiconductor layer comprises indium, gallium, and zinc.

11. The semiconductor device according to claim 8, wherein the oxide semiconductor layer comprises a crystal region.

12. The semiconductor device according to claim 8,
    wherein one of the source electrode and the drain electrode is provided between the substrate and the oxide semiconductor layer, and
    wherein the other of the source electrode and the drain electrode is provided between the oxide semiconductor layer and the gate insulating layer.

13. The semiconductor device according to claim 8, wherein the source electrode and the drain electrode are provided between the oxide semiconductor layer and the gate insulating layer.

14. A power circuit comprising the semiconductor device according to claim 8.

* * * * *